(12) United States Patent
Gregorius et al.

(10) Patent No.: US 7,693,247 B2
(45) Date of Patent: Apr. 6, 2010

(54) PHASE LOCKED LOOP HAVING REDUCED INHERENT NOISE

(75) Inventors: Peter Gregorius, München (DE);
Martin Streibl, Petershausen (DE);
Thomas Rickes, München (DE)

(73) Assignee: Infineon Technologies AG, Munich (DE)

( * ) Notice: Subject to any disclaimer, the term of this patent is extended or adjusted under 35 U.S.C. 154(b) by 1154 days.

(21) Appl. No.: 11/238,331

(22) Filed: Sep. 26, 2005

(65) Prior Publication Data
US 2007/0071156 A1   Mar. 29, 2007

(51) Int. Cl.
*H03D 3/24* (2006.01)

(52) U.S. Cl. .................................................... 375/374

(58) Field of Classification Search ................. 375/215, 375/294, 327, 354, 357, 369, 372, 375, 376, 375/373; 370/395.62, 507, 503; 455/265, 455/180.3, 266; 702/89; 713/375, 100; 342/103; 327/147, 148, 156, 157
See application file for complete search history.

(56) References Cited

U.S. PATENT DOCUMENTS

| | | | | |
|---|---|---|---|---|
| 6,351,164 B1 * | 2/2002 | Yoshie | ........................ | 327/156 |
| 6,900,676 B1 * | 5/2005 | Tamura | ....................... | 327/156 |
| 2005/0162552 A1 * | 7/2005 | Xiu et al. | ....................... | 348/521 |
| 2006/0164137 A1 * | 7/2006 | Van De Beek et al. | ....... | 327/156 |
| 2007/0025490 A1 * | 2/2007 | Azadet et al. | ................. | 375/376 |
| 2007/0291890 A1 * | 12/2007 | Rubin et al. | ................. | 375/376 |

* cited by examiner

*Primary Examiner*—Sam K Ahn
(74) *Attorney, Agent, or Firm*—Patterson & Sheridan, L.L.P.

(57) ABSTRACT

A phase locked loop having reduced inherent noise is provided. The phase locked loop comprises a controlled oscillator for outputting a periodic output signal as a result of a control signal; a feedback unit for providing at least two periodic feedback signals having a constant phase shift to each other and each depending on the output signal; a phase/frequency detector for providing difference signals each depending on a periodic input signal and at least one of the feedback signals; and a control circuit for providing the control signal to the controlled oscillator depending on the difference signals.

26 Claims, 13 Drawing Sheets

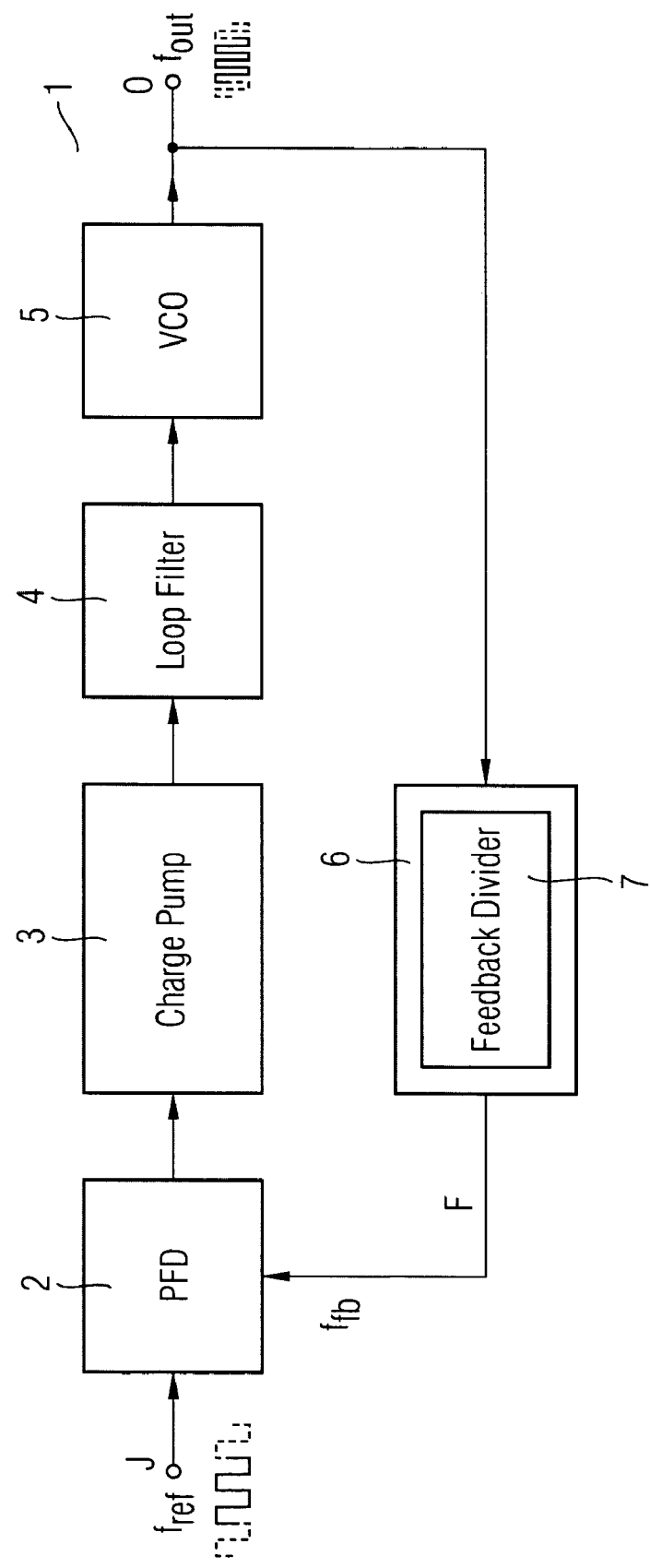

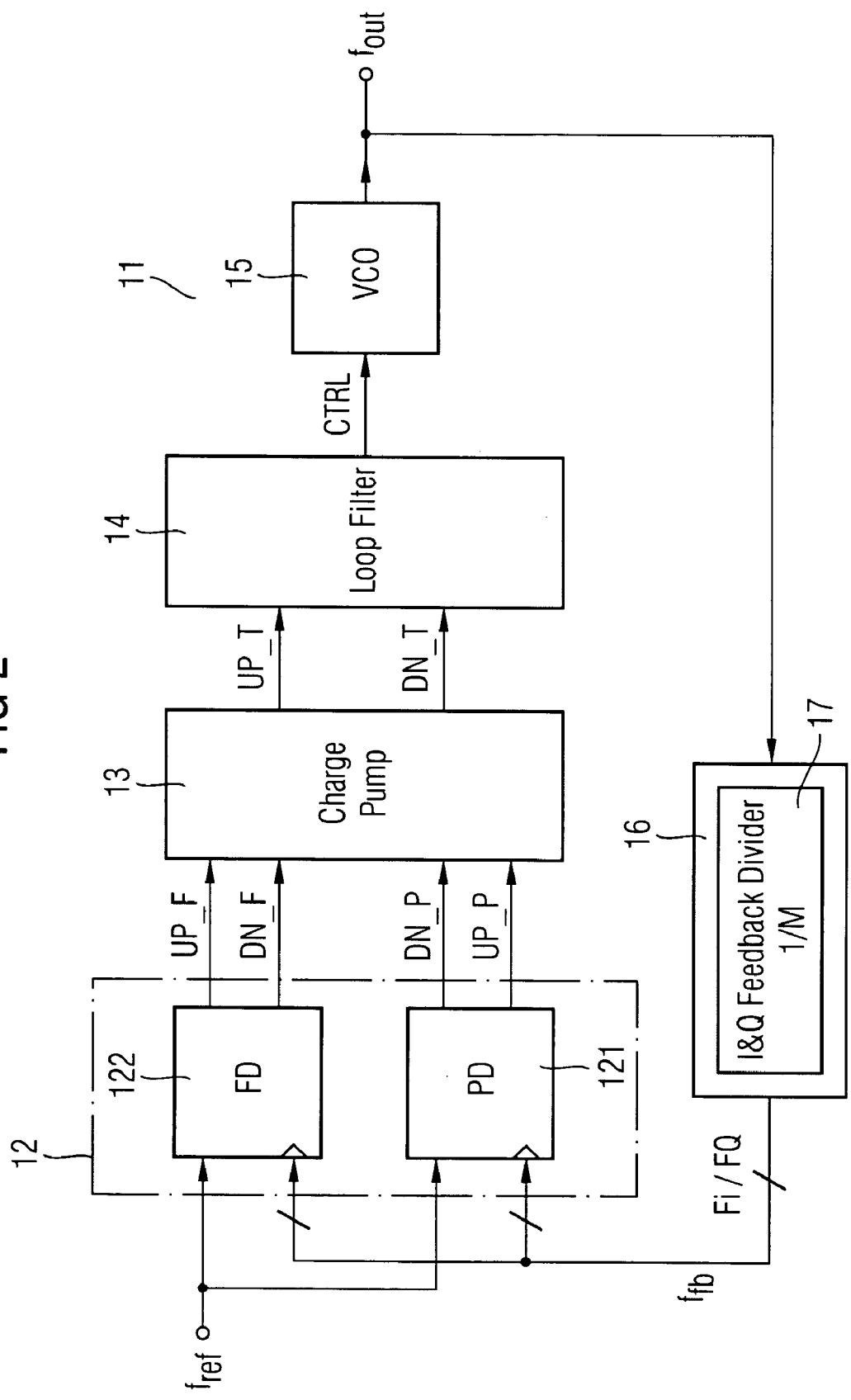

PHASE LOCKED LOOP HAVING REDUCED INHERENT NOISE

BACKGROUND OF THE INVENTION

1. Field of the Invention

The present invention is related to phase locked loops for providing an output signal depending on a periodic input signal. The present invention is further related to phase locked loops having analog or digital phase control loops.

2. Description of the Related Art

An analog phase locked loop circuit usually includes a frequency/phase detector, a charge pump, a loop filter and a voltage controlled oscillator as well as a feedback unit for feeding back the output signal to the frequency/phase detector. The frequency/phase detector is usually provided to compare the input signal with a feedback signal supplied by the feedback unit such that a leading/lagging information is obtained. If the feedback signal is lagging with respect to the input signal, the leading/lagging information results in an increased voltage supplied to the voltage controlled oscillator in such a way that the output signal is increased in its frequency. If the feedback signal is leading with respect to the input signal, the frequency of the output signal is reduced. Thereby, the frequency of the output signal is controlled to be constant at the frequency of the input signal or, if the feedback unit comprises a feedback divider, determined by a multiplication of the division value given by the feedback divider and the input frequency.

As the discrimination of the frequency/phase detector is poor due to the mere detection of a leading and lagging of the feedback signal, a phase locked loop according to the prior art produces an inherent noise as a result of a frequency toggling around the nominal output frequency.

The same is true for a digital phase locked loop circuit as the frequency/phase detector is designed similarly and therefore also has a discrimination which merely provides a leading/lagging information which substantially results in an increase or decrease of the output frequency. This also results in an inherent noise of the output frequency depending on the poor discrimination of the frequency/phase detection.

SUMMARY OF THE INVENTION

Aspects of the present invention provide a phase locked loop and a method for operating a phase locked loop wherein the inherent noise of the control loop can be reduced.

According to a first aspect of the present invention, a phase locked loop is provided comprising: a controlled oscillator for outputting a periodic output signal as a result of a control signal; a feedback unit for providing at least two periodic feedback signals having constant phase shift to each other and each depending on the output signal; a frequency/phase detector for providing difference signals, each depending on a periodic input signal and at least one of the feedback signals; and a control circuit for providing the control signal to the controlled oscillator depending on the difference signal.

One idea of the present invention is to provide more than one feedback signal each of which are phase shifted to the frequency/phase detection. In the phase locked loop, the input signal is sampled with the feedback signal, and the provision of a plurality of feedback signals allows for an "oversampling" of the input signal whereby the discrimination accuracy is increased, i.e., the phase and/or the frequency difference between the input signal and the output signal can be determined more precisely. This allows for improving the control of the output signal frequency as the control is related to the determined and more precise phase and/or frequency differences. The improved control of the output signal frequency results in a reduced inherent noise of the output signal.

Preferably, the frequency/phase detector provides, as one of the difference signals, at least a phase difference signal depending on the result of a comparison between one of the feedback signals and the input signal.

According to another embodiment, the frequency/phase detector provides, as one of the difference signals, at least a frequency difference signal depending on a result of a comparison of one of the feedback signals and the input signal.

The feedback unit may comprise a frequency divider to divide the frequency of the output signal.

The feedback unit may be configured to provide an in-phase feedback signal which has no phase shift with respect to the output signal and a quadrature-phase feedback signal which has a 90° phase shift with respect to the output signal.

The control unit may include a charge pump to provide current pulses in response to the difference signals.

Furthermore, the charge pump may include an adder circuit to add the current pulses.

Further advantageously, the control circuit may include a weighting unit for weighting the current pulses prior to supplying them to the adder circuit.

The control circuit may include a loop filter for receiving the weighed and added current pulses and for supplying a filtered control signal as the control input.

The controlled oscillator may be provided as a dual-loop-oscillator having a number of cascaded differential stages and a cross-connected control stage.

Furthermore, the cascaded differential stages each may include a controlled current source which is controlled such as to provide a coarse tuning of the oscillator.

The cross-connected control stage may include a control transistor which is controlled depending on the control input signal.

Furthermore, the cascaded differential stage and the cross-connected control stage each may include an active load element.

In one embodiment, the cascaded differential stages and the cross-connected control stage may each include a passive load resistor.

Further advantageously, each of the frequency/phase detector, the control unit, the loop filter and the controlled oscillator may be provided as a differential signaling circuit.

Each of the frequency/phase detector may be configured to provide each of the differential signals as a result of a logic comparison of the input signal and at least one of the feedback signals to obtain digital differential signals.

The control unit may include an adder circuit for adding the digital differential signals.

The adder circuit may be configured to weight the differential signals with weight values prior to adding them.

The controlled oscillator may be provided as a digitally controlled oscillator.

According to a further embodiment, the control unit includes a loop filter having a proportional part and an integral part, wherein the proportional part of the adder circuit is directly coupled to the controlled oscillator.

Furthermore, the integral part may comprise a nonlinear integrating circuit.

According to another aspect of the present invention, a phase locked loop is provided comprising: a controlled oscillator for outputting a periodic output signal as a result of a control signal; a feedback unit for providing a periodic in-phase feedback signal which has no phase shift with respect to the output signal and a quadrature-phase feedback signal which has a 90° phase shift with respect to the output signal, depending on the output signal; a frequency/phase detector for receiving the in-phase and quadrature-phase feedback signals and providing difference signals each depending on a periodic input signal and at least one of feedback signals; and a control circuit for providing the control signal to the controlled oscillator depending on the difference signals.

According to another aspect of the present invention, a phase locked loop is provided comprising: a controlled oscillator for outputting a periodic output signal as a result of a control signal; a feedback unit including a feedback divider for dividing the frequency of the output signal by a divider value, wherein the feedback unit is adapted to generate a periodic in-phase feedback signal which has no phase shift with respect to the divided output signal and a quadrature-phase feed back signal which has a 90° phase shift with respect to the divided output signal, depending on the divided output signal; a frequency/phase detector for receiving the in-phase and quadrature-phase feedback signals and providing difference signals each depending on a periodic input signal and at least one of feedback signals; and a control circuit for providing the control signal to the controlled oscillator depending on the difference signals.

According to another aspect of the present invention, a phase locked loop is provided comprising: a controlled oscillator for outputting a periodic output signal as a result of a control signal; a feedback unit including a feedback divider for dividing the frequency of the output signal by a divider value, wherein the feedback unit is adapted to generate a periodic in-phase feedback signal which has no phase shift with respect to the divided output signal and a quadrature-phase feed back signal which has a 90° phase shift with respect to the divided output signal, depending on the divided output signal; a frequency/phase detector for receiving the in-phase and quadrature-phase feedback signals and providing difference signals each depending on a periodic input signal and at least one of feedback signals; and a control circuit for providing the control signal to the controlled oscillator depending on the difference signals, wherein the frequency/phase detector is adapted to provide the difference signals as differential signals, wherein the control circuit and the controlled oscillator are configured in a differential logic.

According to another aspect of the present invention, a method is provided for operating a phase locked loop, the method comprising: outputting a periodic output signal as a result of a control signal; providing at least two periodic feedback signals having a constant phase shift to each other and each depending on the output signal; providing difference signals each depending on a periodic input signal and at least one of the feedback signals; and providing the control signal to the controlled oscillator depending on the difference signals.

In one embodiment, as one of the difference signals, at least a phase difference signal depending on the result of a comparison between one of the feedback signals and the input signal is provided.

In a further embodiment, as one of the difference signals, at least a frequency difference signal depending on the result of a comparison between one of the feedback signals and the input signal is provided.

The frequency of the output signal may be divided to obtain the feedback signals.

As the feedback signals, an in-phase feedback signal which has no phase shift with respect to the output signal and a quadrature-phase feedback signal which has a 90° phase shift with the output signal may be provided.

Each of the difference signals may be provided as a result of a logic comparison of the input signal and at least one of the feedback signals.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a block diagram of an analog phase locked loop according to the prior art;

FIG. 2 shows block diagram of a phase locked loop according to one embodiment of the present invention;

DETAILED DESCRIPTION OF THE PREFERRED EMBODIMENT

Figure 3A:
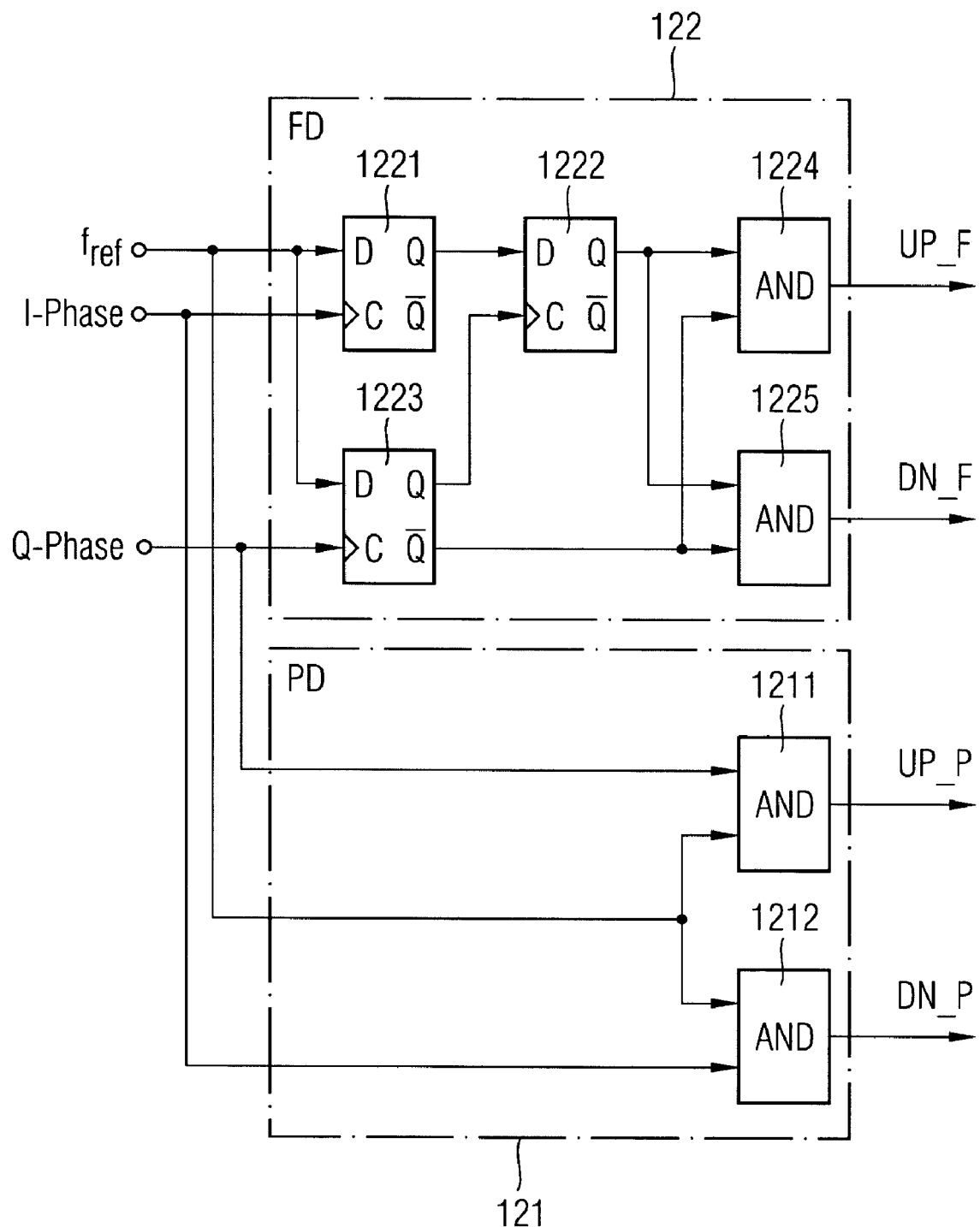
FIG. 3A shows a more detailed view of the frequency phase detector of the analog phase locked loop of FIG. 2.

In FIG. 1, a block diagram of an analog phase locked loop circuit 1 is depicted. The phase locked loop circuit 1 comprises a phase/frequency detector (PFD) 2 which receives an input signal J having an input frequency $f_{ref}$ and a feedback signal F having a feedback frequency $f_{fb}$. The phase/frequency detector 2 compares the input signal J and the feedback signal F and supplies a leading/lagging information to a charge pump circuit 3. The charge pump 3 transforms the leading/lagging information to current pulses which are provided via a loop filter 4 to a voltage controlled oscillator (VCO) 5 which provides an output signal O having a frequency $f_{OUT}$. The output of the voltage controlled oscillator 5 is coupled to a feedback loop, and the output of the feedback loop provides the feedback signal F supplied to the respective input of the phase/frequency detector 2 as mentioned above.

Such a phase locked loop circuit is known in the art and provides an output signal O having a frequency which is determined by the frequency $f_{ref}$ of the input signal J and the division factor provided by the feedback divider 7.

One disadvantage of such a phase locked loop circuit according to the prior art is that the leading/lagging information is generated as digital pulses which merely indicate that the feedback signal F which is substantially in phase to the output signal is leading or lagging with respect to the input frequency such that the frequency $f_{OUT}$ of the output signal O is increased or decreased, respectively. As the phase/frequency detector 2 is merely capable to determine a positive or negative phase shift between the input signal J and the feedback signal F the frequency $f_{out}$ of the output signal O is subjected to inherent noise as a result thereof. Furthermore, the reaction time of the phase/frequency detector 2 further limits the discrimination of the frequency/phase detection.

In FIG. 2, a block diagram of an analog phase locked loop circuit according to an embodiment of the present invention is shown. As shown, a phase locked loop circuit 11 comprises a frequency/phase detector 12, a charge pump 13, a loop filter 14 and a voltage controlled oscillator 15 which are connected in series as known from the phase locked loop circuit according to the prior art. Furthermore, feedback unit 16, which includes a feedback divider 17, is provided in a feedback loop which couples the output signal O to respective inputs of the frequency/phase detector 12.

In contrast to the analog phase locked loop circuit 1 according to the prior art, the feedback unit 16 receives the output signal O, supplies the output signal O to the feedback divider 17 to divide its frequency by the predetermined division factor and generates a first and a second feedback signal which have the same divided frequency and a predetermined phase shift. In a preferred embodiment, the first feedback signal is an in phase feedback signal FI which is in phase with the output signal O and the quadrature-phase feedback signal FQ which has a phase shift with regard to the output signal O at 90. The generation of the predetermined phase shift between the first and the second feedback signal is substantially known in the art and can be securely provided by means of counters, flip-flops, shift registers and the like. According to embodiments of the invention, the number of feedback signals FI/FQ generated from the output signal O in the feedback unit 16 is not limited to two; any other numbers of feedback signals F can be generated from the output signal O each having a unique predetermined phase shift.

In the following description of the illustrative embodiments, a phase locked loop circuit is provided with two feedback signals, which are the in-phase feedback signal FI and the quadrature-phase feedback signal FQ. The feedback signals FI/FQ are supplied to the frequency/phase detector 12. The frequency/phase detector 12 comprises a phase detector 121 and a frequency detector 122.

As shown in FIG. 3A, the phase detector 121 comprises a first AND gate 1211 and a second AND gate 1212. The first AND gate 1211 has a first input which the in-phase feedback signal FI is supplied to and a second input which the input signal I is supplied to. An output of the first AND gate 1211 provides a first phase difference signal UP_P. Similarly, the second AND gate 1212 is supplied on a first input with the quadrature-phase feedback signal FQ and on the second input with the input signal 1. An output of the second AND gate 1212 provides a second phase difference signal DN_P. The first and the second phase difference signals are substantially PCM-signals (Pulse-Code Modulated signals) used to control the charge pump 13 as described below.

Further with regard to FIG. 3A, the frequency detector 122 has a first D-flip-flop 1221 having a data input D which the input signal I is applied to and clock input C which the in-phase feedback signal FI is applied to. A non-inverting output O of the first D-flip-flop 1221 is coupled to a data input D of a second D-flip-flop 1222. A third D-flip-flop 1223 has a data input D which is coupled to the input signal I and a clock input C which the quadrature-phase feedback signal FQ is applied to. The non-inverting output /Q of the third D-flop-flop 1223 is applied to a clock input C of the second D-flip-flop circuit 1222. A non-inverting output Q of the second D-flip-flop 1222 is coupled to a first input of a third AND gate 1224 and a first input of a fourth AND gate 1225. An inverting output /Q Of the third D-flip-flop 1223 is coupled to a second input of the third AND gate 1224 as well as to a second input of the fourth AND gate 1225. An output of the third AND gate 1224 provides a first frequency difference signal UP_F and an output of the fourth AND gate 1225 provides a second frequency difference signal DN_F.

The first and second frequency difference signals UP_F, DN_F as well as the phase difference signals UP_F, DN_F are PCM signals used to control a respective current flow in the charge pump circuit 13 connected downstream.

Figure 3B:
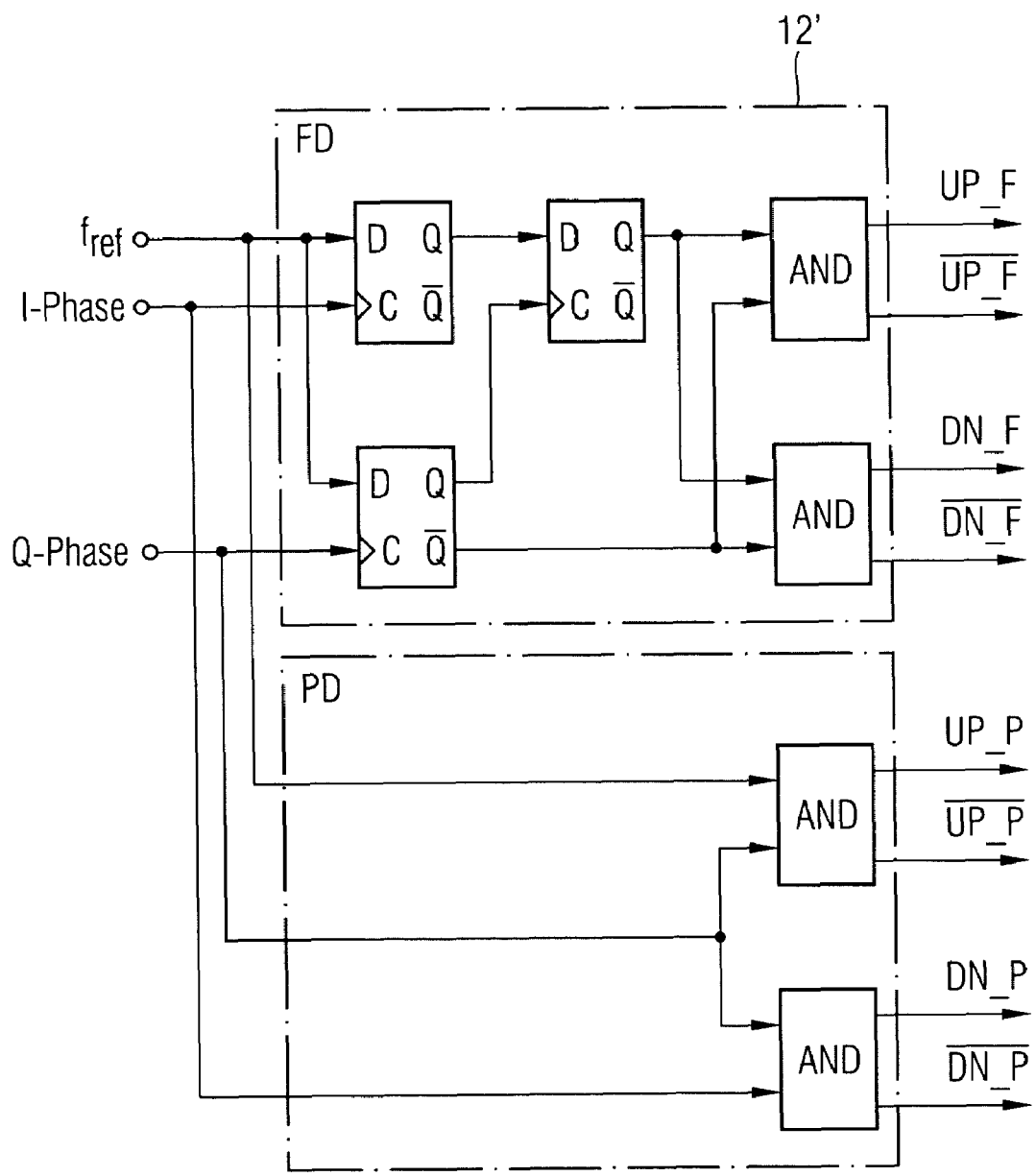
FIG. 3B shows a further design of the frequency phase detector applicable within the analog phase locked loop of FIG. 2 having differential outputs.

In FIG. 3B, a frequency/phase detector 12' is shown which differs from the frequency phase detector 12 of FIG. 3A merely in that the first to fourth AND gates are provided in a differential logic such that each output of the AND gates provides differential signals for a more robust signal transmission between the frequency/phase detector 12' and the following charge pump 13.

Figure 4A:
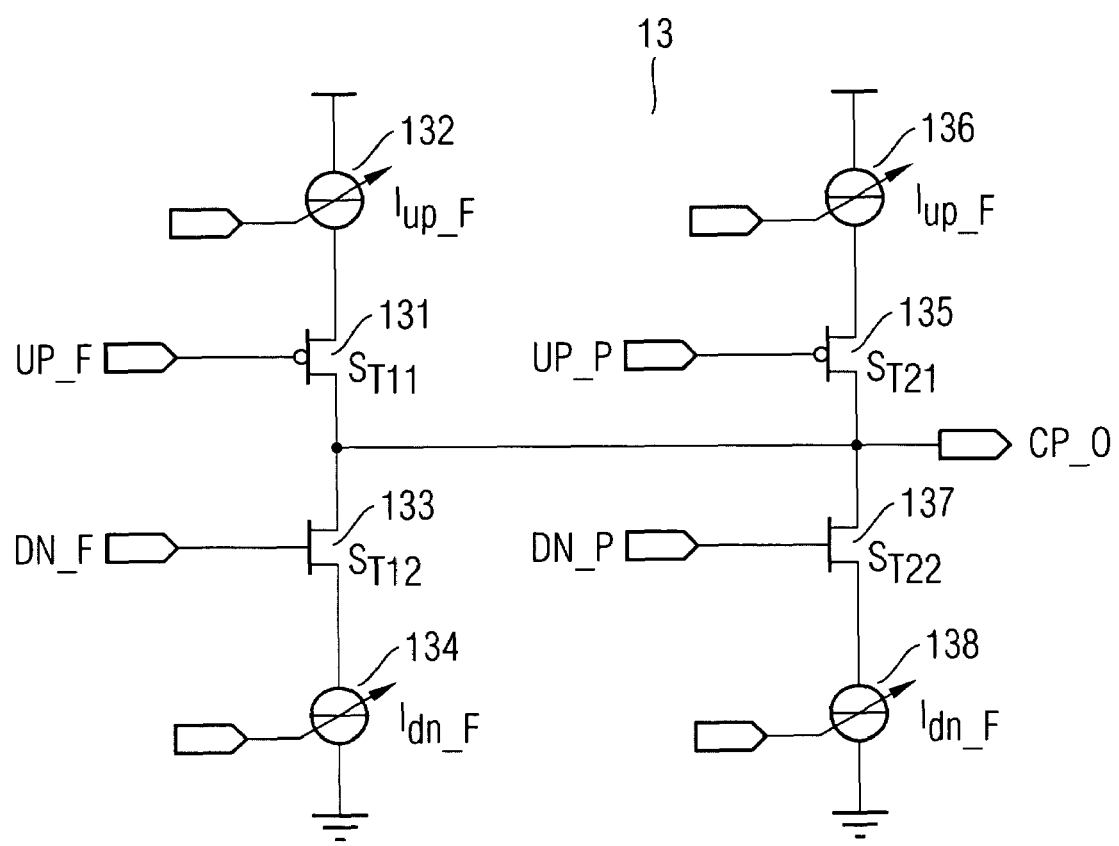
FIG. 4A shows a charge pump circuit applicable within the phase locked loop of FIG. 2.

In FIG. 4A, a charge pump circuit 13 is illustrated in more detail. The first and second frequency difference signals UP_F, DN_F as well as the first and second phase difference signals UP_P, DN_P are used to control the current flow of the respective current source to a current output CP_O. In detail, the first frequency difference signal UP_F is coupled to a gate input of a p-type FET transistor by which the application of a first current source 132 providing a first position current to the current output CP_O is controlled. The second frequency difference signal DN_F is coupled to a n-type FET-transistor 133 by means of which the application of a second current source providing a second negative current to the current output CP_O is controlled. The first phase difference signal UP_P coupled to a gate input of a third p-type FET-transistor 135 by means of which the application of a third current source 136 providing a third position current to the current output CP_O is controlled. The second phase difference signal DN_P is coupled to the gate input of a fourth n-type FET-transistor by means of which the application of a fourth current source 138 providing a fourth negative current to the current output CP_O can be controlled.

Since the first and second frequency difference signals and the first and second phase difference signals are PCM-signals, the charge pump serves to transform the digital PCM-signals into an analog current. Since all of the current sources 132, 134, 136, 138 are connected to the current output CP_O, their respective currents are accumulated. Since the first and third current sources 132, 136 supply positive currents and the second and the fourth current sources 134, 138 supply negative currents, differences between the first and second frequency difference signals UP_F, DN_F as well as between the first and second phase difference signals UP_P, DN_P is obtained. The resulting differences are finally added. The strength of each of the current sources 132, 134, 136, 130 can differ from each other to provide a weighting of the difference between the frequency difference signals and a weighting of the difference of the phase difference signals with respect to the effect on the frequency change to be obtained.

Figure 4B:
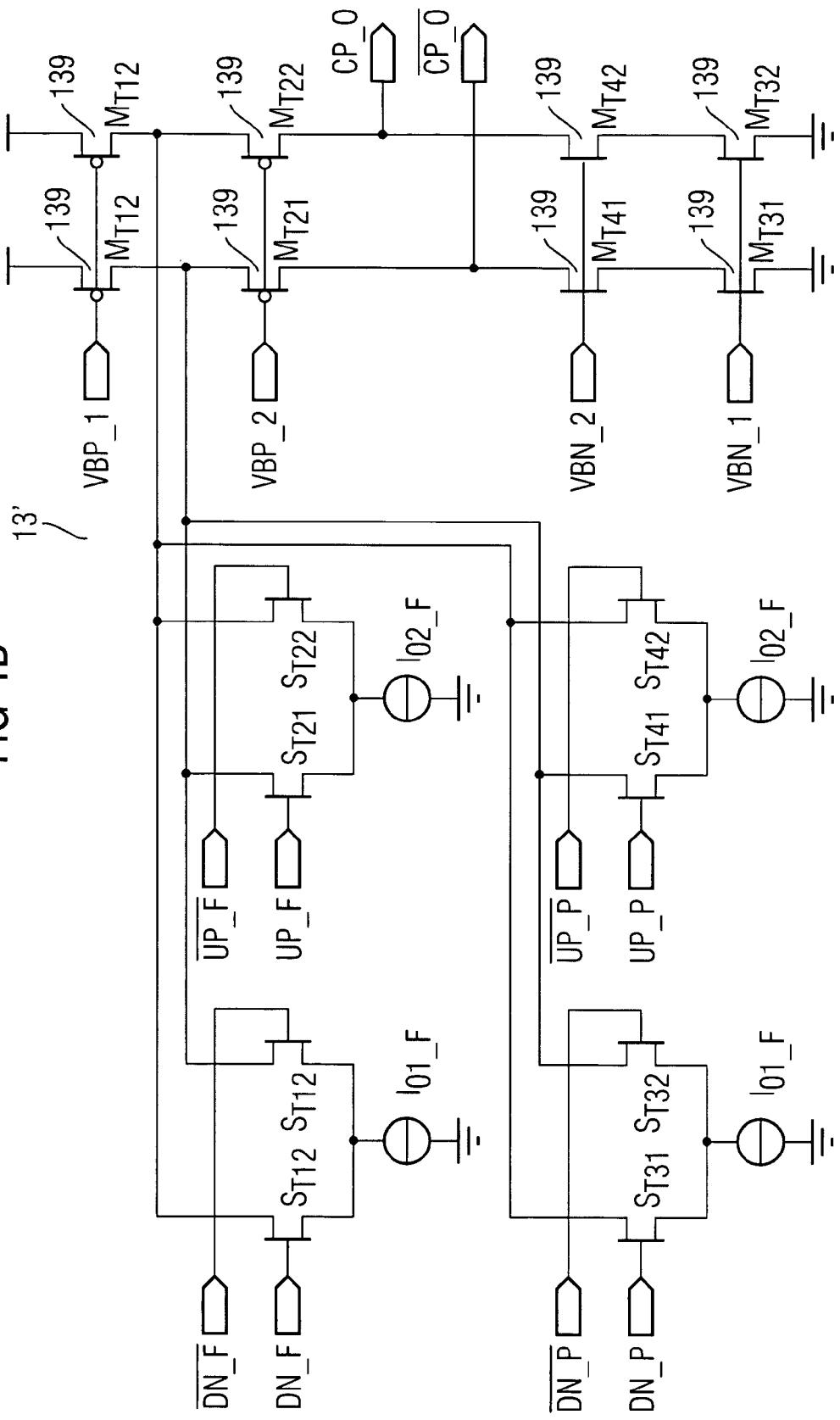
FIG. 4B shows a further design of a charge pump circuit applicable within the phase locked loop of FIG. 2 and with the frequency phase detector of FIG. 3B.

FIG. 4B shows a charge pump circuit 13' in differential logic which is operated with the differential frequency difference signals UP_F, /UP_F, DN_F, /DN_F and differential phase difference signals UP_P, /UP_P, DN_P, /DN_P supplied by, e.g., a charge pump circuit 12' as shown in FIG. 3B. The charge pump circuit 13' substantially operates similarly to the charge pump circuit 13 such that for each of the differential frequency difference signals UP_F, /UP_F, DN_F, /DN_F and phase difference signals UP_P, /UP_P, DN_P, /DN_P, a respective current source is provided which is controllably applied to a common differential output node CP_O, /CP_O for providing a differential current output. A weighting of each of the currents is performed by means of weighting transistors 139 controlled by respective weighting signals VBP_1, VBP_2, VBN_1, VBN_2, applied to their respective gates.

Figure 5A:
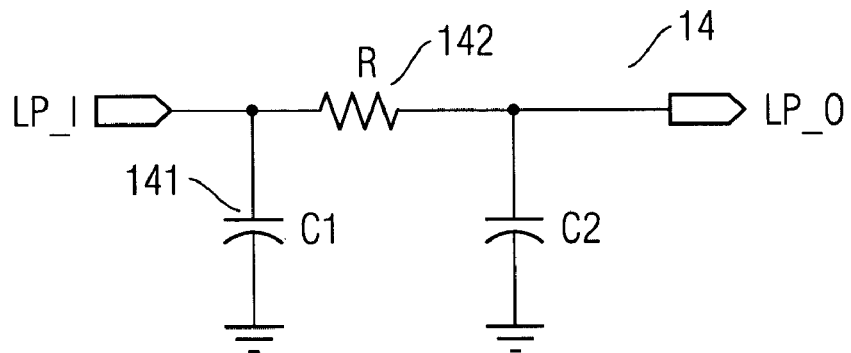
FIGS. 5A to 5C illustrate embodiments of loop filters applicable with the analog phase locked loop of FIG. 2.
Figure 5B:
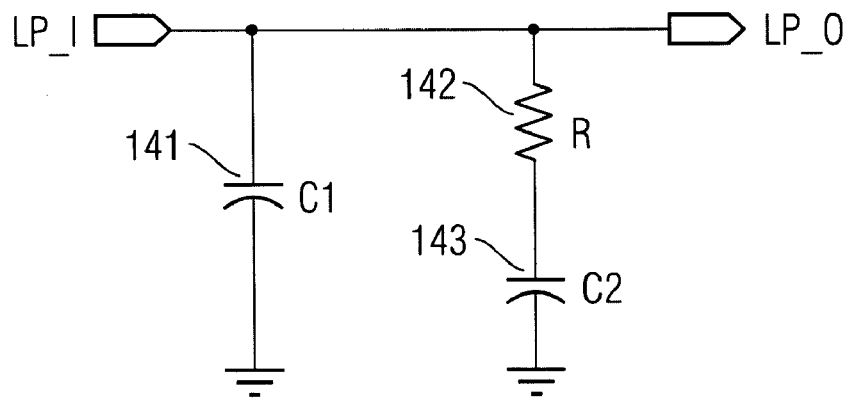
Figure 5C:
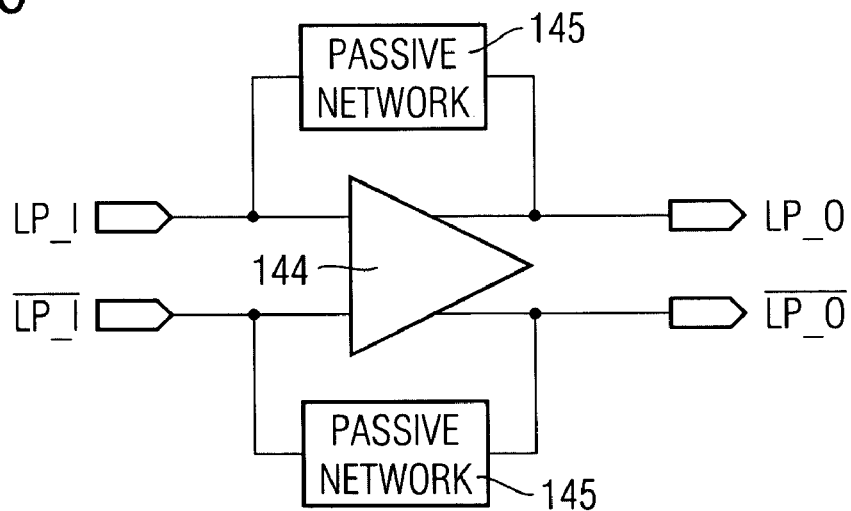

In FIGS. 5A to 5C, different embodiments of loop filters as known in the art are shown. In FIG. 5A, the loop filter is designed as a low pass filter wherein a first capacitor 141 is coupled between an input of the loop filter and ground potential. A first resistor 142 is coupled with a first port to the input of the loop filter and with a second port to the output of the loop filter. The second port of the resistor 142 is also connected with a first port of a second capacitor 143 which is connected with its second port to the ground potential. Another embodiment of the loop filter is shown in FIG. 5B wherein the first resistor 142 is coupled instead in series with the second capacitor 143. As shown in FIG. 5C, the loop filter can also be realized as an active filter having a differential amplifier 144 which is fed back by a passive network 145 as known in the art.

Figure 6:
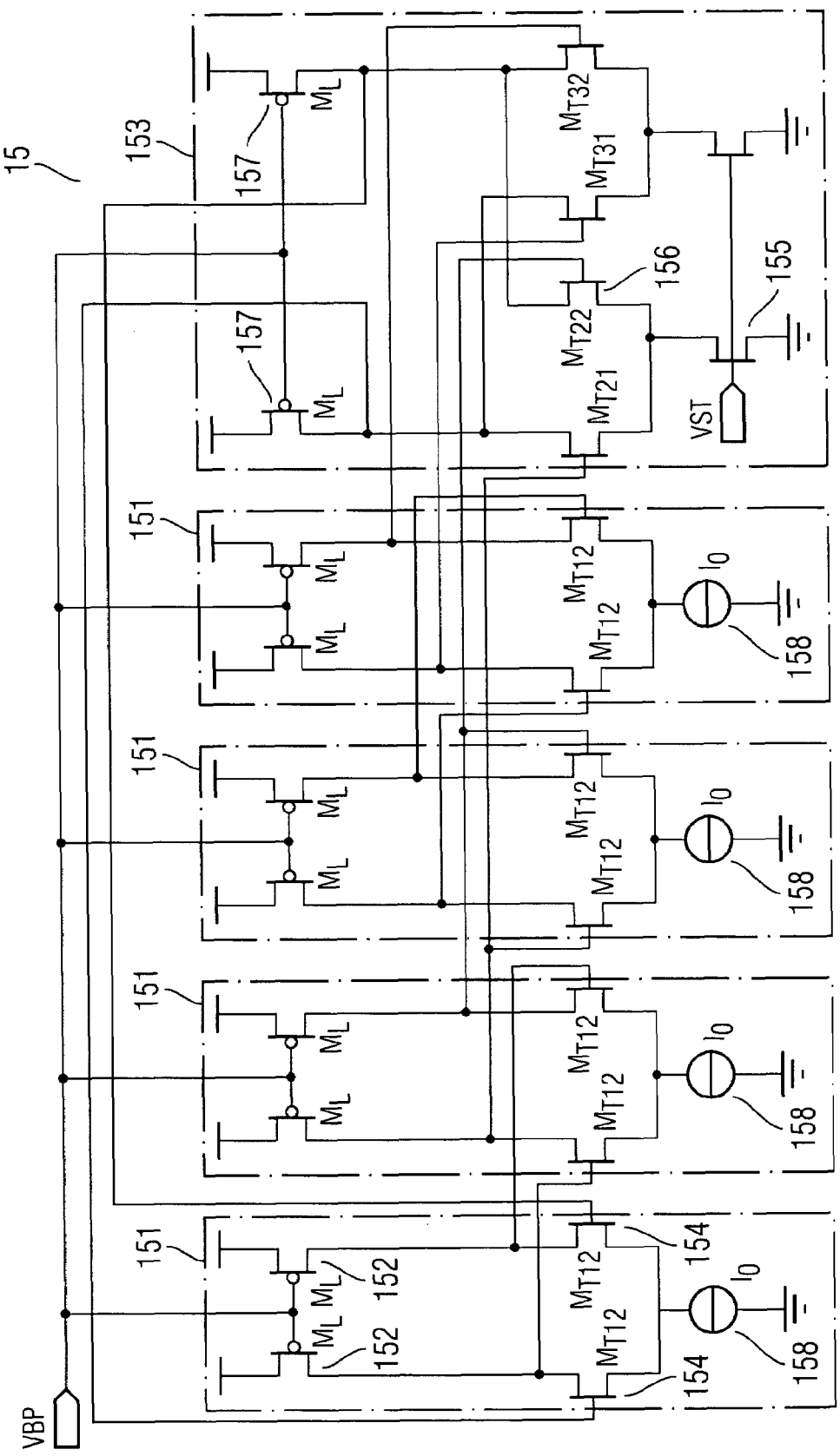
FIG. 6 shows one embodiment of a voltage controlled oscillator applicable within the phase locked loop of FIG. 2 having active loads.

In FIG. 6, one embodiment of a voltage controlled oscillator 15 for generating the output signal is shown. The voltage controlled oscillator 15 is provided as a dual loop oscillator comprising four identical cascaded differential stages 151. Each of the differential stages 151 has an active load which is realized by two p-MOS transistors 152 which are controlled via a bias voltage VBP by which the total current in each of the differential stages 151 can be controlled. Each of the differential stages 151 further comprises two n-MOS transistors 154 each of which is in series with one of p-MOS transistors 151 of the respective differential stage 151. The sources of the n-MOS transistors 154 are both coupled with a current source 158 providing a predetermined current by which a course adjustment of the frequency of the output signal O is set. The differential stages 151 are cascaded and the outputs of the second of the differential stages 151 and the output of the fourth of the differential stages are coupled with the gates of n-MOS transistors 156 of two differential units of a cross coupled control stage 153. Each of the differential units two n-MOS transistors 156, the sources of which are coupled with a further n-MOS transistors 155 which is controlled by a control voltage VST. Both of the differential units 156 are coupled with pull-up p-MOS transistors 157 such that one of the n-MOS transistors 156 of each of the differential units is connected to a drain of one of the pull-up p-MOS transistors 157 while the other one of the n-MOS transistors 156 of each of the differential units is coupled to the other one of the pull-up p-MOS transistors 157. The nodes between the pull-up p-MOS transistors 157 and the n-MOS transistors 156 of the differential units are fed back to the gate inputs of the n-MOS transistors 154 of the first one of the cascaded differential stages 151. Thereby, a dual loop oscillator can be realized in a differential design. The four cascaded differential stages 151 are responsible for the basic oscillation of the oscillator depending on the current IU predetermined by the current sources.

Figure 7:
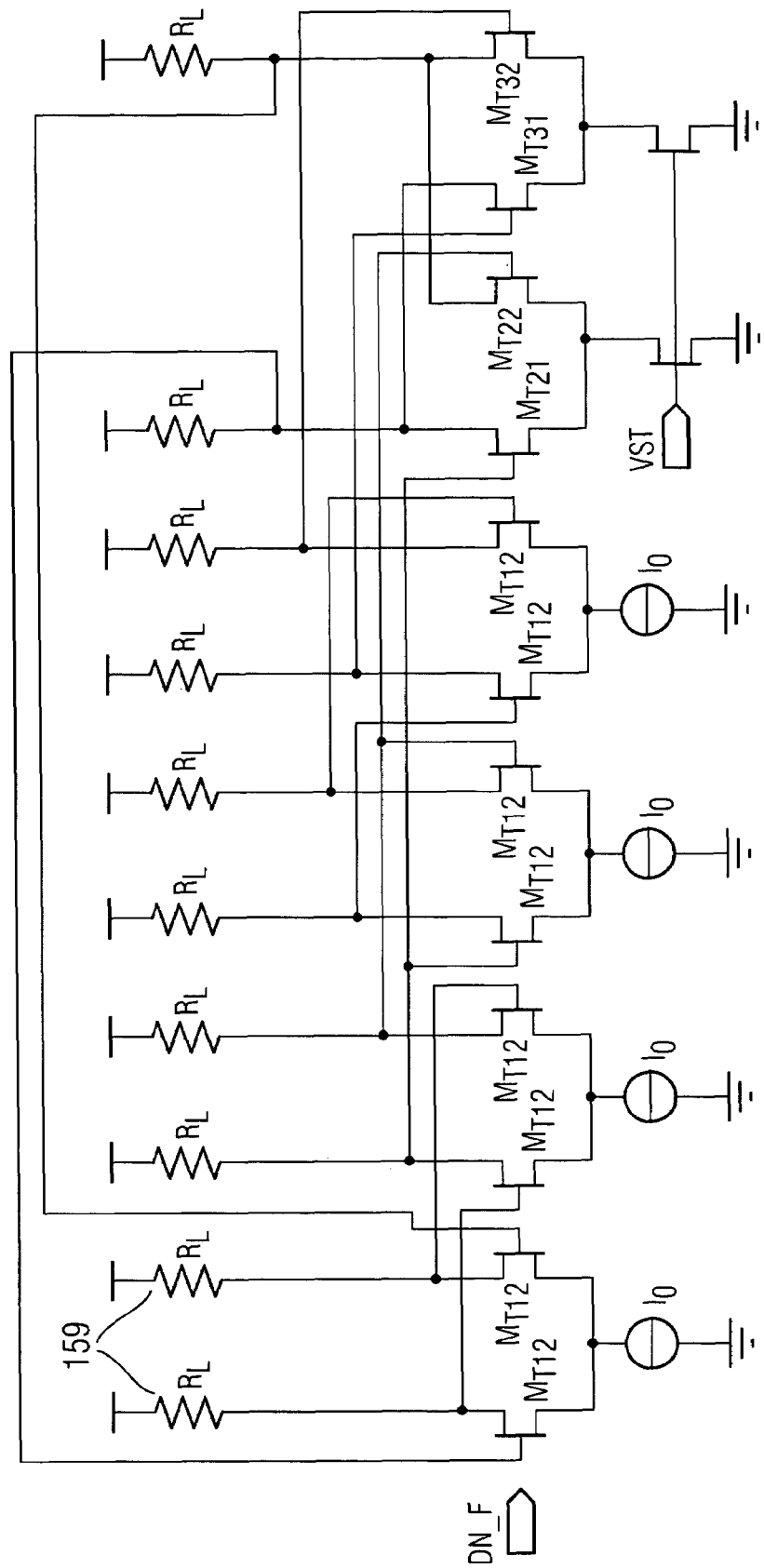
FIG. 7 shows one embodiment of a voltage controlled oscillator applicable with the phase locked loop of FIG. 2 having passive loads.

With respect to FIG. 7, another embodiment of dual loop oscillator is shown wherein, in contrast to the embodiment of FIG. 6, the loads are realized as passive load by means of respective resistors 159.

Figure 8:
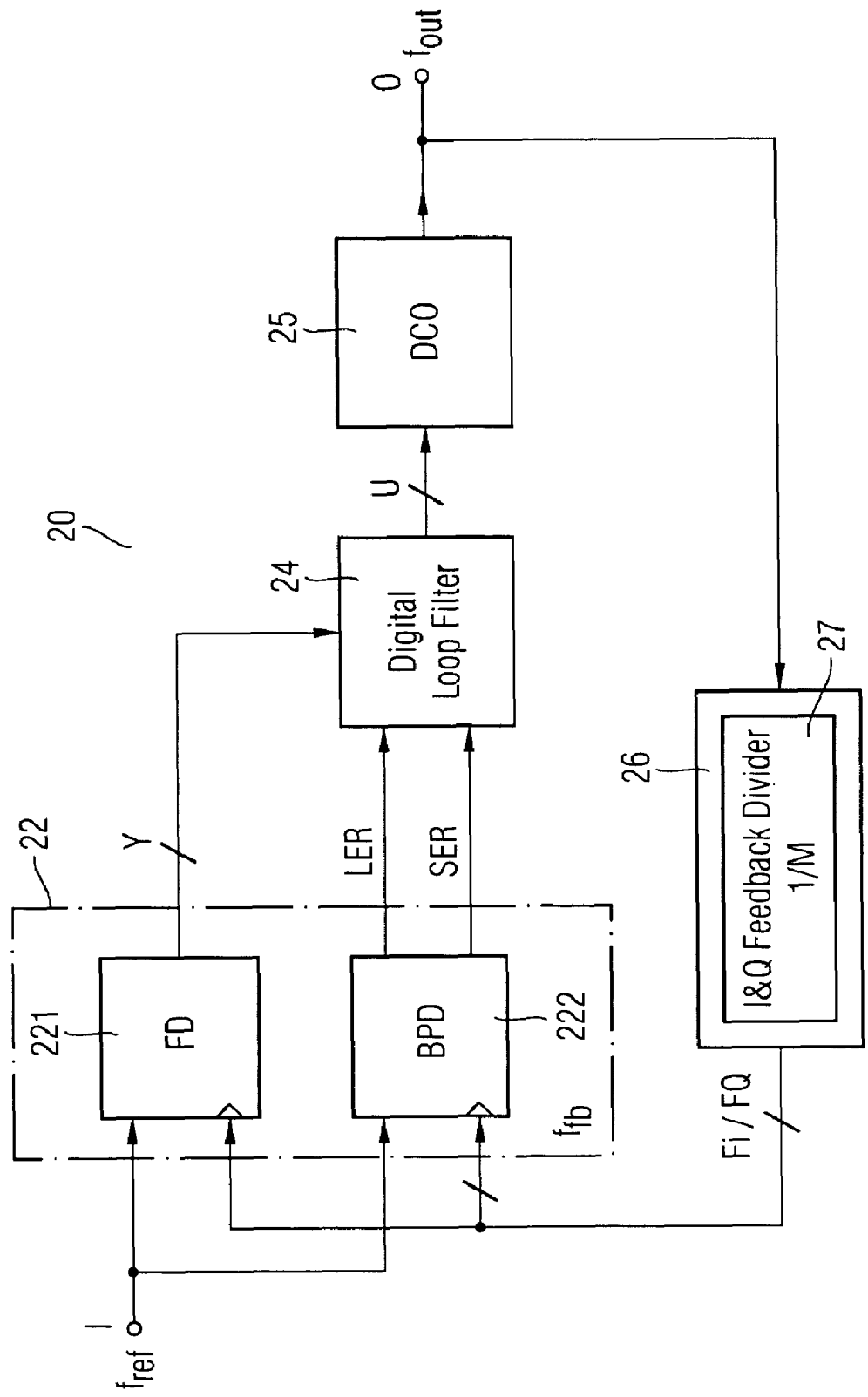
FIG. 8 shows a block diagram of a digital phase locked loop according to another embodiment of the present invention.

In FIG. 8, a block diagram of a digital phase locked loop circuit according to another embodiment of the present invention is shown. The phase locked loop circuit 20 comprises a frequency/phase detector 22, a digital loop filter 24 and a digitally controlled oscillator 25 which form a control loop. An output of the digitally controlled oscillator 25 provides the output signal O having a frequency $f_{out}$. The output signal O is fed back via a feedback unit 26, which may include a feedback divider 26, to the frequency/phase detector 22.

The illustrated digital phase locked loop 20 operates in a substantially similar manner as the analog phase locked loop of FIG. 2. The feedback unit 26 is adapted to generate more than one feedback signals F having a predetermined frequency which is determined by the frequency $f_{out}$ of the output signal and the division factor provided by the feedback divider 27 included in the feedback unit 26. Each of the plurality of feedback signals F therefore has a same frequency and a unique predetermined phase shift. In one embodiment, two feedback signals are generated, e.g., an in-phase feedback signal F1 which is in phase with respect to the output signal O (or with respect to the output signal O the frequency of which is divided by the division factor in the feedback divider 27) and a quadrature-phase feedback signal FQ which has a phase shift with respect to the in-phase feedback signal of 90.

The frequency/phase detector 22 comprises a frequency detector 221 and a phase detector 222, to each of which the in-phase feedback signal FI, the quadrature-phase feedback signal FO and the input signal T are applied. Each of the frequency detector 221 and the phase detector 222 generates frequency and phase difference signals, respectively, which are provided to the signal loop filter 24, an output of which supplies a control valve to the digitally controlled oscillator 25. The digital loop filter 24 can be operated in a synchronous o asynchronous manner with regard to the input signal and/or a clock signal.

Figure 9:
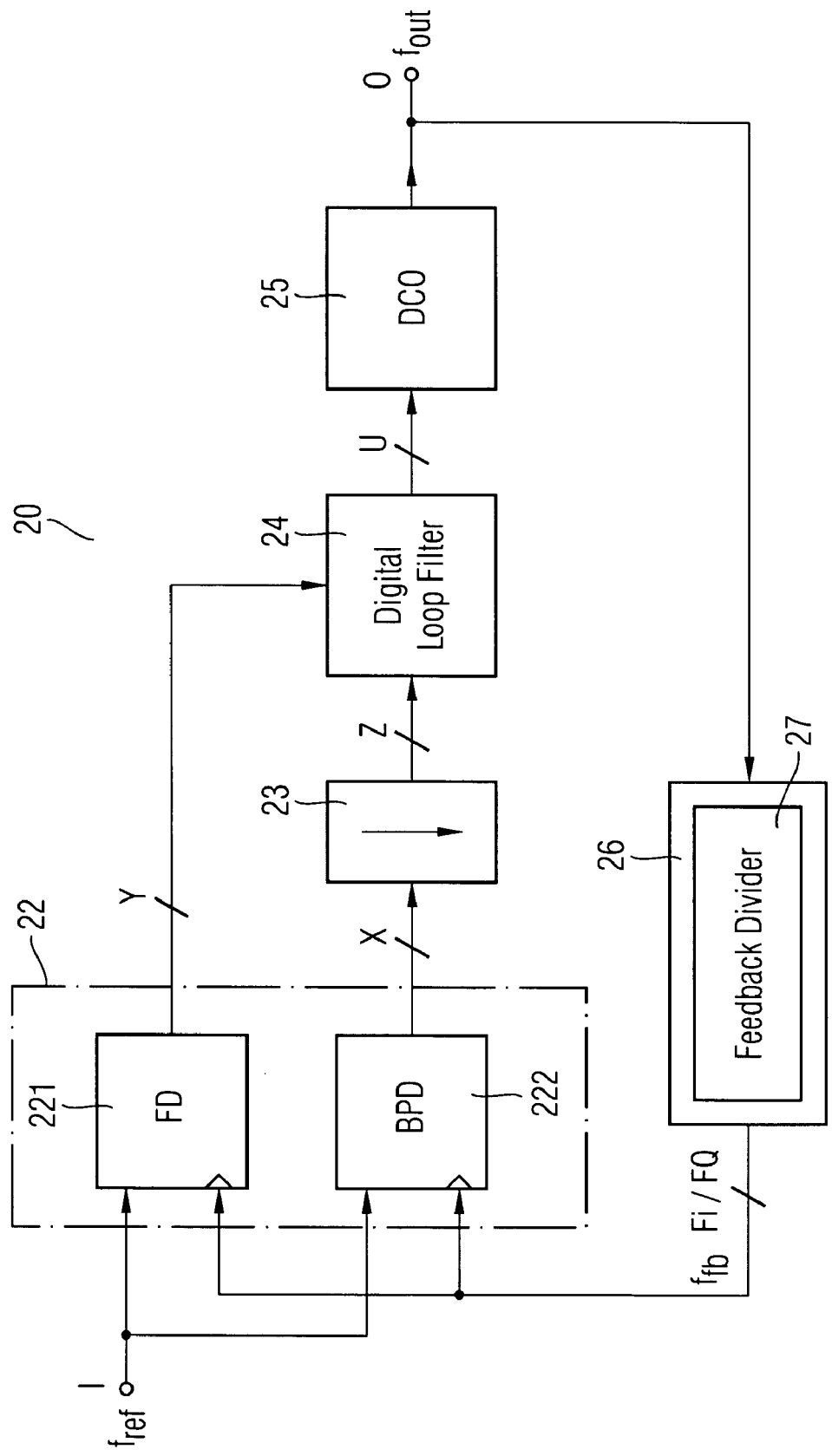
FIG. 9 shows a block diagram of a digital phase locked loop according to an embodiment of the present invention including a decimator between the frequency phase detector and the digital loop filter for reducing the internal frequency of the control loop.

According to an optional embodiment as shown in FIG. 9, a decimator 23 is provided between the phase detector 222 and the digital loop filter 24. The decimator 23 allows for reducing the frequency of the phase difference signals supplied by the phase detector 222. The phase detector 222 generates phase differences signals LER, SER which are parallelized in the decimator 23 to parallelized phase difference signals FER1, SER1. The parallelized phase difference signals FER1, SER1 are provided to the digital loop filter 24 wherein the phase difference information can be further supplied with a lower frequency to the loop filter 24 such that the design of the digital loop filter 24 may be less restrictive.

Figure 10:
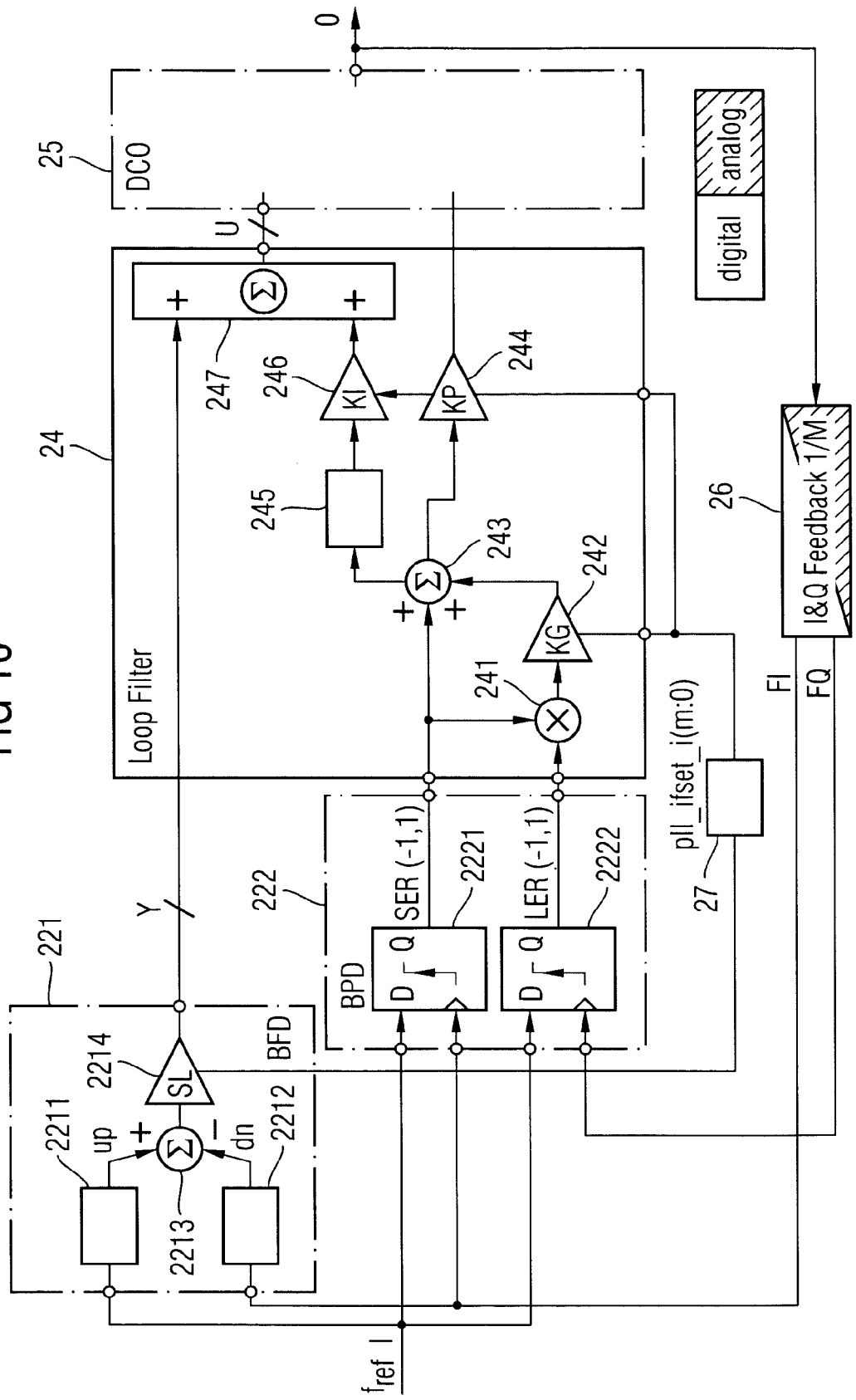
FIG. 10 shows a more detailed block diagram of the digital phase locked loop according to the embodiment of FIG. 8.

In FIG. 10, the digital phase locked loop circuit 20 of FIG. 8 is illustrated in more detail. The frequency detector 221 comprises a first counter 2211 and a second counter 2212. The first counter 2211 receives via an input the input signal having the input frequency $f_{ref}$ and the second counter receives via an input, the in-phase feedback signal FI which represents the output signal O (or the output signal which is divided by the division factor in the feedback divider 27). An output of the first counter 2211 provides a first counter value, and an output of the second counter 2212 provides a second counter value. A difference unit 2213 receives the first and second counter values and supplies a difference value indicating the difference between the first and the second counter values. The difference value is weighted in a first weighting unit 2214, and the weighted difference value is supplied to an input of the loop filter 24.

The phase detector 222 includes a first flip-flop 2221 and a second flip-flop 2222. The first flip-flop 2221 receives the input signal I at a data input and the in-phase feedback signal FI at a clock input. The second D-flip-flop 2222 receives at a data input the input signal I and at a clock input the quadrature-phase feedback signal F. Both D-flip-flops 2221, 2222 preferably latch the data input on a rising edge of the respective signals applied at the respective clock inputs. The usage of other kinds of flip-flop circuits in the phase detector 222 is also appropriate, e.g., a flip-flop which latches data on a falling edge. The first D-flip-flop 2221 supplies a first phase difference signal SER, and the second D-flip-flop 2222 supplies a second phase difference signal LER. The first and second phase difference signals SER, LER are provided to the respective inputs of the loop filter 24. The first and second phase difference signal SER, LER each are coded as values of "−1" and "1" and thus include an information in which quadrant of the possible phase shift between the output signal O and the input signal I is located. As the in-phase feedback signal FI and the quadrature-phase feedback signal FQ has a phase shift of 90, the resolution of the indication of the phase is such that the two phase difference signals SER, LER indicate the quadrant of the phase shift between the input signal I and the output signal O represented by the in-phase feedback signal FI. While the first D-flip-flop 2221 generates the first phase difference signal SER which indicates if the phase shift is between 0 and 180 (indicated by the value "1") or between 0 and −180 (indicated by the value "−1") the second D-flip-flop 2222 provides the second phase difference signal LER which indicates if the phase shift between the output signal O and the input signal I is either between one of 0 and 90 and −90 and −180 (indicated by a value "1") or between one of 90 and 180 and 0 and −90 (indicated by a value "−1").

In the loop filter 24, the first and second phase difference signals SER, LER are received. The fist and second phase difference signals SER, LER are multiplied in a multiplier 241 and weighted in a second weighting unit 242 by a weighting factor KG. The first phase difference signal SER is further supplied to an adder 243 which adds the weighted multiplied second phase difference signal LER and the first phase difference signal SER. An output of the adder 243 is weighted in a third weighting unit 244 by a third weighting factor KP and directly provided as a control value to the digitally controlled oscillator 25 as a proportional portion of the loop filter. A further output of the adder 243 supplies the added phase difference values to a third counter 245 which serves as an integrator wherein an output of the integrator is coupled to a fourth weighting unit 246 which multiplies the integrated value by the factor KI. The weighted integrated value as well as the weighted frequency difference value as the output of the frequency detector 221 are provided to an input of a second adder 247. Both values are added therein and provided as a further digital control value to the digitally controlled oscillator 25.

The digitally controlled oscillator receives the control values of the second adder 247 and the output of the second weighting unit 244 and sets the output of the second weighting unit 244 and sets the output frequency depending on the control values.

By means of the multiplier 241 and the first adder 243 in the loop filler 24, it can be detected if the phase difference between the input signal I and the output signal O is within −90 and 90 of within 90 and 270. Thereby, it is possible to detect if the phase difference between the input signal and the output signal is small (in the range of −90 to 90) or large (in the range of 90 and 270). Accordingly, the control values for the digitally controlled oscillator result in an adapting of the frequency of the output signal wherein a selected small phase shift between the input signal I and the output signal O results in a small frequency change as a response of the digitally controlled oscillator 25 wherein a large phase difference between the input signal and the output signal results in a larger frequency change in the digitally controlled oscillator 25.

The first to fourth weighting units 2214, 242, 244, 246 can be controlled by a control unit 27 wherein the weighting factors SL, KG, KP, KI are selected to optimize the function of the digital phase locked loop circuit 20 mainly regarding the aspect for avoiding additionally inherent noise of the output signal O.

As the inherent noise of the digital phase locked loop 20 is affected by the loop latency of the control loop, the output of the first adder 243 is directly coupled to the digitally controlled oscillator 25 (by means of the third weighting unit 244). This reduces the latency for the proportional portion of the control value.

Figure 11:
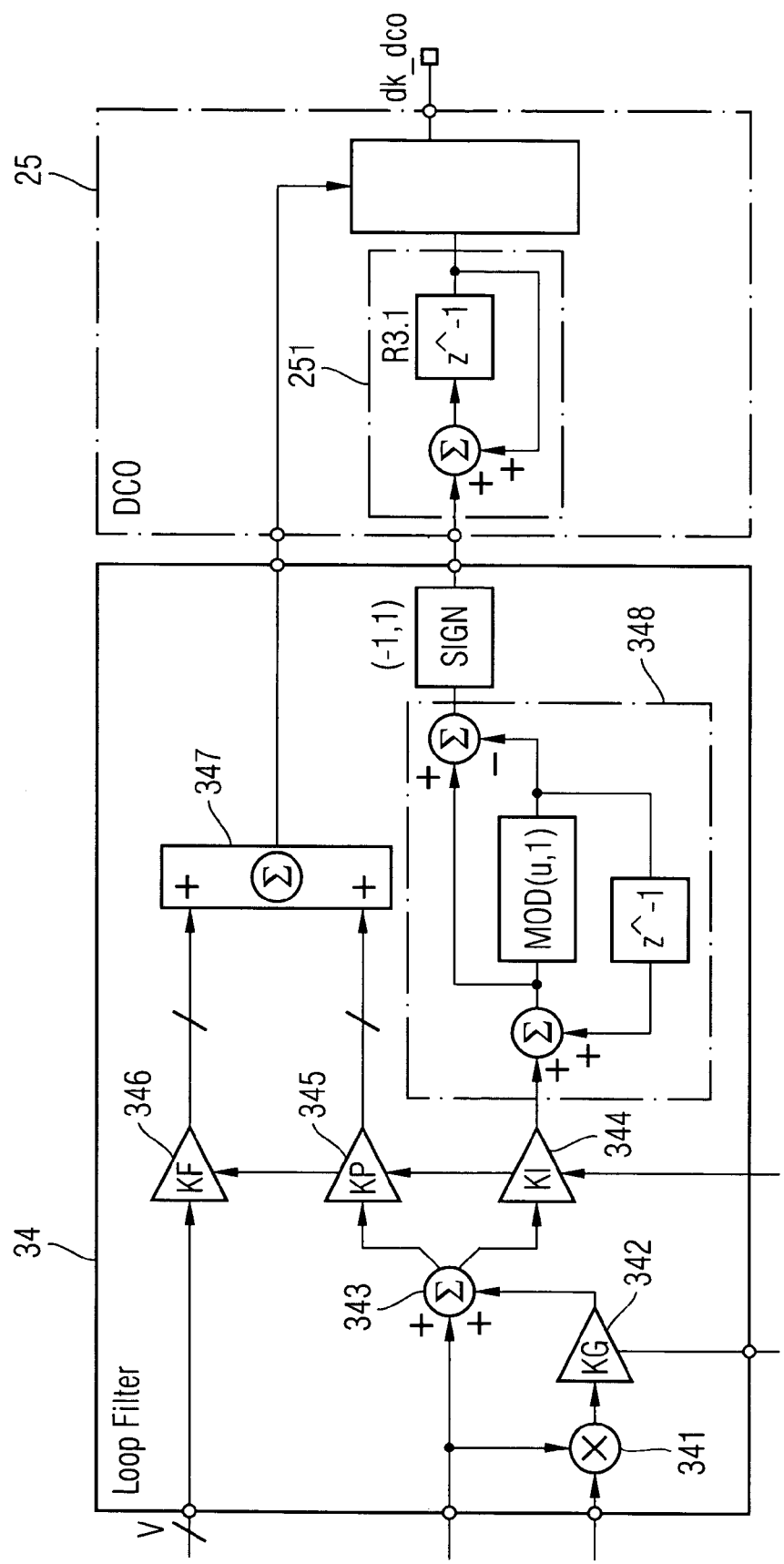
FIG. 11 shows another loop filter for a further embodiment of the digital phase locked loop according to the embodiment of FIG. 8.

In FIG. 11, a modified loop filter 34 for use in a digital phase locked loop 20 is shown in FIG. 10 is illustrated. The modified loop filter 34 comprises a multiplier 341 which multiplies the first and second phase difference signals SER, LER provided by the phase detector 222 and provides the multiplied phase difference signal to a fifth weighting unit 342 which weighs the multiplied phase difference signals by a multiplication factor KG. The first phase difference signal SER and the multiplied weighed phase difference signals are added in a fourth adder 343 wherein the result is supplied to a sixth weighting unit 344 and a seventh weighting unit 345. The frequency difference signal is provided to an eighth weighting unit 346 which weighs the frequency difference value by a multiplication factor KF. The weighted frequency difference value and the adder output value weighted by the multiplication factor KP in the seventh weighting unit 345 are supplied to a fifth adder 347 which adds the respective weighed difference values and supplies the added result to the digitally controlled oscillator 25 as a control value.

The output of the fourth adder 343 which is weighed by the fifth weighting unit 344 is coupled to a first integrator 348 including a modulo function and a sign function. The result of the first integrator is provided to a second integrator 251 which may be provided in the digitally controlled oscillator 25. The second integrator 251 accumulates the sign pulses and can be realized by means of a barrel shifter, the output of which is formatted to serve as a further control value for the digitally controlled oscillator 25, and the like.

An advantage of the modified loop filter 34 is that the latency of the digitally controlled oscillator 25 can be avoided. As already mentioned in the embodiment of FIG. 10, the multiplication factors KG, KI, KP, KF of the embodiment of FIG. 11 can be programmed by means of the control unit 27 or the like.

While the foregoing is directed to embodiments of the present invention, other and further embodiments of the invention may be devised without departing from the basic scope thereof, and the scope thereof is determined by the claims that follow.

What is claimed is:

1. A phase locked loop, comprising:
   a controlled oscillator for outputting a periodic output signal as a result of a control signal;

a feedback unit for providing at least two periodic feedback signals having a constant phase shift to each other, wherein each feedback signal depends on the output signal, and wherein the at least two periodic signals comprise an in-phase feedback signal which has no phase shift with respect to the output signal and a quadrature-phase feedback signal which has a 90° phase shift with respect to the output signal;

a frequency/phase detector for providing difference signals, each difference signal depending on a periodic input signal and at least one of the feedback signals; and a control circuit for providing the control signal to the controlled oscillator depending on the difference signals, the control circuit comprising a charge pump that provides current pulses in response to the difference signals and adds the current pulses to provide a current output; wherein at least one of the difference signals provided by the frequency/phase detector is a phase difference signal depending on the result of a comparison between one of the feedback signals and the input signal; and at least one other of the difference signals provided by the frequency/phase detector is a frequency difference signal depending on the result of a comparison between one of the feedback signals and the input signal.

2. The phase locked loop of claim 1, wherein the at least one of the difference signals provided by the frequency/phase detector that is a phase difference signal depending on the result of a comparison between one of the feedback signals and the input signal comprises two of the difference signals.

3. The phase locked loop of claim 1, wherein the at least one other of the difference signals provided by the frequency/phase detector that is a frequency difference signal depending on the result of a comparison between one of the feedback signals and the input signal comprises two of the difference signals.

4. The phase locked loop of claim 1, wherein the feedback unit comprises a frequency divider for dividing the frequency of the output signal.

5. The phase locked loop of claim 1, wherein the control unit includes a weighting unit for weighing the current pulses prior to adding the pulses to provide the current output.

6. The phase locked loop of claim 5, wherein the control unit includes a loop filter for receiving the weighed and added current pulses and for supplying a filtered control signal as the control input.

7. The phase locked loop of claim 6, wherein the controlled oscillator is provided as a dual-loop-oscillator having a number of cascaded differential stages and a cross-connected control stage.

8. The phase locked loop of claim 7, wherein each cascaded differential stage includes a controlled current source which is controlled to provide a coarse tuning of the oscillator.

9. The phase locked loop of claim 8, wherein the cross-connected control stage includes a control transistor which is controlled depending on the control input signal.

10. The phase locked loop of claim 9, wherein the cascaded differential stages and the cross-connected control stage each include an active load element.

11. The phase locked loop of claim 9, wherein the cascaded differential stages and the cross-connected control stage each include a passive load resistor.

12. The phase locked loop of claim 7, wherein each of the frequency/phase detector, the control unit, the loop filter, and the controlled oscillator is provided as a differential signaling circuit respectively.

13. The phase locked loop of claim 1, wherein the controlled oscillator is provided as a digitally controlled oscillator.

14. A method for operating a phase locked loop, comprising:

outputting from a controlled oscillator a periodic signal as a result of a control signal;

providing via a feedback unit at least two periodic feedback signals having a constant phase shift to each other, wherein each feedback signal depends on the output signal, and wherein the feedback signals comprise:

an in-phase feedback signal which has no phase shift with respect to the output signal; and a quadrature-phase feedback signal which has a 90° phase shift with respect to the output signal;

providing via a frequency/phase detector difference signals, each difference signal depending on a periodic input signal and at least one of the feedback signals; and providing via a control circuit the control signal to the controlled oscillator depending on the difference signals, the control circuit providing current pulses via a charge pump in response to the difference signals and adds the current pulses to provide a current output; wherein at least one of the difference signals provided by the frequency/phase detector is a phase difference signal depending on the result of a comparison between one of the feedback signals and the input signal; and at least one other of the difference signals provided by the frequency/phase detector is a frequency difference signal depending on the result of a comparison between one of the feedback signals and the input signal.

15. The method of claim 14, wherein the at least one of the difference signals that is a phase difference signal depending on the result of a comparison between one of the feedback signals and the input signal comprises two of the difference signals.

16. The method of claim 14, wherein the at least one other of the difference signals that is a frequency difference signal depending on the result of a comparison between one of the feedback signals and the input signal comprises two of the difference signals.

17. The method of claim 16, wherein the frequency of the output signal is divided.

18. The method of claim 14, wherein the current pulses are weighed via a weighting unit prior to adding the pulses to provide the current output.

19. The method of claim 18, wherein the weighed and added current pulses are filtered via a loop filter to supply a filtered control signal as the control input.

20. The method of claim 19, wherein:

the controlled oscillator comprises a dual-loop-oscillator having a number of cascaded differential stages and a cross-connected control stage; and the method further comprises:

controlling current in each of the cascaded differential stages; and providing outputs of the cascaded differential stages to the cross-connected control stage.

21. The method of claim 20, wherein the controlling current in each cascaded differential stage comprises controlling a controlled current source which is controlled to provide a coarse tuning of the oscillator.

22. The method of claim 21, wherein:

the cross-connected control stage includes a control transistor; and the method further comprises controlling the control transistor depending on the control signal.

23. The method of claim 22, wherein:

the cascaded differential stages and the cross-connected control stage each include an active load element; and the method further comprises controlling current in each of the cascaded differential stages via the active load element.

24. The method of claim 22, wherein:

the cascaded differential stages and the cross-connected control stage each include a passive load resistor; and the method further comprises controlling current in each of the cascaded differential stages via the passive load resistor.

25. The method of claim 20, wherein each of the frequency/phase detector, the control unit, the loop filter, and the controlled oscillator function as differential signaling circuits.

26. The method of claim 14, further comprising digitally controlling the oscillator.

* * * * *